(12) United States Patent
Jang et al.

(10) Patent No.: US 12,047,812 B2
(45) Date of Patent: Jul. 23, 2024

(54) FRONTHAUL MULTIPLEXER

(71) Applicant: SOLiD, Inc., Seongnam-si (KR)

(72) Inventors: Ho Sik Jang, Seongnam-si (KR); Hoo Pyo Hong, Seongnam-si (KR); Woo Jae Kim, Suwon-si (KR); Dong Hee Kwon, Yongin-si (KR); Jeong Won Kang, Yongin-si (KR)

(73) Assignee: SOLiD, Inc., Seongnam-si (KR)

( * ) Notice: Subject to any disclaimer, the term of this patent is extended or adjusted under 35 U.S.C. 154(b) by 118 days.

(21) Appl. No.: 17/727,794

(22) Filed: Apr. 24, 2022

(65) Prior Publication Data
US 2023/0017897 A1    Jan. 19, 2023

(30) Foreign Application Priority Data
Jul. 16, 2021    (KR) .................. 10-2021-0093667

(51) Int. Cl.
*H04W 28/06*    (2009.01)
*H03M 7/30*    (2006.01)
*H04W 88/08*    (2009.01)

(52) U.S. Cl.
CPC ....... *H04W 28/065* (2013.01); *H03M 7/3062* (2013.01); *H04W 88/085* (2013.01)

(58) Field of Classification Search
CPC .......... H04W 28/065; H04W 88/085; H03M 7/3062; H03M 7/30; H04B 10/00; H04B 10/25752; H04B 10/29; H04L 69/04
See application file for complete search history.

(56) References Cited

U.S. PATENT DOCUMENTS

| | | | |
|---|---|---|---|
| 2017/0126845 A1* | 5/2017 | Pole | H04L 43/16 |
| 2018/0124640 A1* | 5/2018 | Jiang | H04W 28/06 |
| 2018/0232182 A1* | 8/2018 | Suzuki | G06F 3/0661 |
| 2019/0034333 A1* | 1/2019 | Sazegari | H03M 7/6023 |
| 2019/0124564 A1* | 4/2019 | Bathwal | H04W 36/08 |
| 2020/0310756 A1 | 10/2020 | Rubanovich et al. | |

FOREIGN PATENT DOCUMENTS

| | | |
|---|---|---|
| JP | 2019-012937 A1 | 1/2019 |
| JP | 2020-017815 A | 1/2020 |
| WO | 2020/031602 A1 | 2/2020 |
| WO | WO-2020192940 A1 * | 10/2020 |

(Continued)

OTHER PUBLICATIONS

Japanese Office Action mailed May 9, 2023 from the Japanese Patent Office for Japanese Application No. 2022-076665.
(Continued)

*Primary Examiner* — Ian N Moore
*Assistant Examiner* — Latresa A McCallum
(74) *Attorney, Agent, or Firm* — Insight Law Group, PLLC; Seung Lee

(57) ABSTRACT

A fronthaul multiplexer according to one aspect of the present invention combines uplink packets in a compressed state that is received from two or more radio units so that the uplink packets are accumulated and combined immediately when received or the uplink packets are recompressed using a compressing method with high compression efficiency when stored in a memory in order to reduce a use amount of memory.

4 Claims, 5 Drawing Sheets

(56) References Cited

FOREIGN PATENT DOCUMENTS

WO    WO-2021187848 A1 * 9/2021  .......... H04W 28/065

OTHER PUBLICATIONS

Extended European Search Report mailed Oct. 18, 2022 for European Application No. 22170960.3.
Office Action mailed Oct. 28, 2022 for European Application No. 22170960.3.
Zhu Paikun et al: "Ultra-Low-Latency, High-Fidelity Analog-to-Digital-Compression Radio-Over-Fiber (ADX-RoF) for MIMO Fronthaul in 5G and Beyond", Journal of Lightwave Technology, IEEE, USA, vol. 39, No. 2, Oct. 7, 2020 (Oct. 7, 2020), pp. 511-519, XP011828604.

* cited by examiner

FRONTHAUL MULTIPLEXER

CROSS-REFERENCE TO RELATED APPLICATION(S)

This application claims priority from Korean Patent Application No. 10-2021-0093667, filed on Jul. 16, 2021, in the Korean Intellectual Property Office, the disclosure of which is incorporated herein by reference in its entirety.

BACKGROUND

1. Field

The following description relates to a signal relay apparatus, and more specifically, to a technology in which a signal relay apparatus combines compressed uplink signals in a fronthaul section.

2. Description of Related Art

Competition for speed and service quality is accelerating among mobile communication operators around the world. Since mobile traffic is rapidly increasing due to video services and the like, operators have no choice but to increase the number of base station sites and thus have employed a Centralized/Cloud radio access network (C-RAN) structure in order to solve cost and operation problems. The C-RAN structure is a structure in which digital units (DUs) and radio units (RUs) are separated from each other, and the DUs are gathered and operated in one site. In a Long-Term Evolution (LTE) network, a communication interface of a common public radio interface (CPRI) is used between DUs and RUs, and in a fifth generation (5G) network, a communication interface of an enhanced CPRI (eCPRI) is used.

In the case of the CPRI, when a signal with 20 MHz bandwidth is transmitted in a 2×2 multiple-input and multiple-output (MIMO) structure, 2.5 Gbps is required, and a transmission amount continuously increases as a system grows. Therefore, an IQ data compression technology is employed in the CPRI, and IQ data is also compressed and transmitted through the eCPRI.

In a 5G wireless communication network using new radio (NR), a fronthaul multiplexer, which copies downlink fronthaul traffic and transmits the copied downlink fronthaul traffic to a plurality of RUs or combines uplink fronthaul traffic received from the plurality of RUs, is used between the DU and the RU. In many cases, since the fronthaul multiplexer is generally implemented using a field programmable gate array (FPGA) or an application specific integrated circuit (ASIC), a memory capacity is not sufficient, and an increase in capacity thereof is not easy. However, the fronthaul multiplexer, which processes eCRPI traffic that requires a high transmission bandwidth, should store packets for a predetermined time in order to combine the packets received from the plurality of RUs having different delay times. Since the delay time is related to a distance from the RU, a memory capacity is also related to the delay time. A method of increasing a serviceable distance while using the same memory capacity is required.

Generally, since a fronthaul multiplexer combines and transmits uplink signals received from a plurality of remote units, and IQ data of a CPRI or an eCPRI is compressed and used, the fronthaul multiplexer decompresses signals compressed for combining the uplink signals, combines the decompressed signals, compresses the combined signals, and transmits the compressed signals to an upper node. In a process of combining the signals, since decompressing and compressing processes are additionally performed, there is a problem in that a delay in signal transmission occurs.

SUMMARY

The proposed invention is directed to providing an apparatus capable of expanding a serviceable area by optimizing use of a memory in a fronthaul network.

In addition, the proposed invention is also directed to providing an apparatus which combines compressed IQ data of uplink signals in a fronthaul network without decompressing the IQ data.

In one aspect of the present invention, a fronthaul multiplexer combines uplink packets received from two or more radio units in a fronthaul network and a includes a packet reception unit, a buffer unit, a combining unit, and a packet output unit.

The packet reception unit may receive the uplink packets from two or more radio units, and a buffer unit may include an internal memory and sequentially store the received packets.

The combining unit may include an operation unit and a combining control unit, the operation unit may combine the packets in a compressed state that is stored in the buffer unit, and the combining control unit may instruct the operation unit to combine the packets when all packets to be combined are received and output a combined result of the operation unit.

The packet output unit may output a combined uplink packet.

In another aspect of the present invention, an operation unit may accumulate and maintain a combined result and accumulate packets in a compressed state that is stored in a buffer unit with a previously combined result, and when the packets are stored in the buffer unit, a combining control unit may determine whether the packets are to be combined, transmit the packets to the operation unit, determine whether combining is completed, output a combined result of the operation unit, and initialize the combined result.

In still another aspect of the present invention, a buffer unit may include a conversion storage unit, wherein the buffer unit may check a compression method of received packets, and when a checking result indicates that the compression method is not a set first compression method, the packets may be recompressed using the first compression method and stored in the conversion storage unit. In this case, the first compression method may be a compression method of which compression efficiency is highest among compression methods supported by the fronthaul multiplexer.

In yet another aspect of the present invention, a buffer unit may further include an external memory, the buffer unit may distribute and store received packets in an internal memory and the external memory, and a distribution rate may be determined on the basis of a rate between a total throughput of the fronthaul multiplexer and a throughput of the external memory.

In yet another aspect of the present invention, when a set waiting time has elapsed, a combining control unit may stop combining and output a currently stored combined result.

DETAILED DESCRIPTION

The above-described and additional aspects of the present invention will be realized from embodiments described with reference to the accompanying drawings. It is understood that components in the embodiments may be variously combined in one embodiment as long as there are no contradictory statements therebetween. Although a block of a block diagram may denote a physical component in some cases, the block may denote a partial function of one physical component or may logically denote a function performed by a plurality of components in other cases. In some cases, the substance of a block or a part of the block may be a set of program commands. Some or all blocks may be realized by hardware, software, or a combination thereof.

Figure 1:
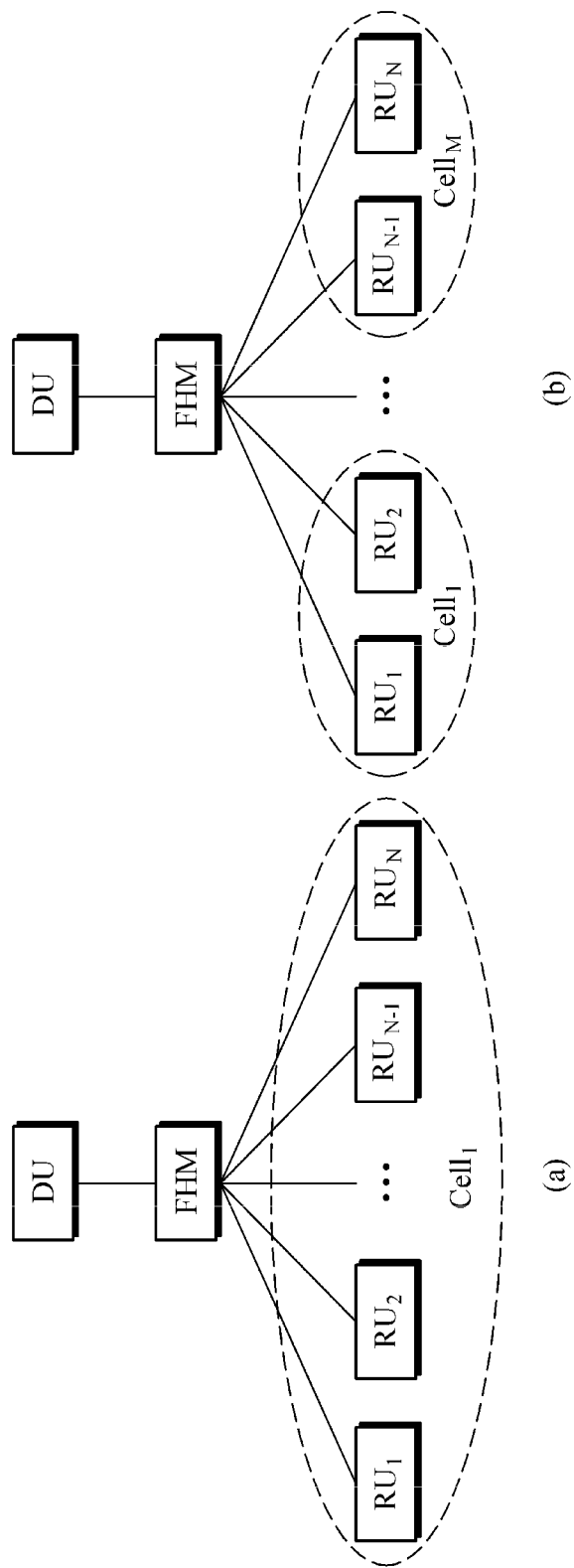
FIG. 1 is a set of views illustrating an example in which a fronthaul multiplexer of the present invention is applied to a fronthaul network.
Figure 2:
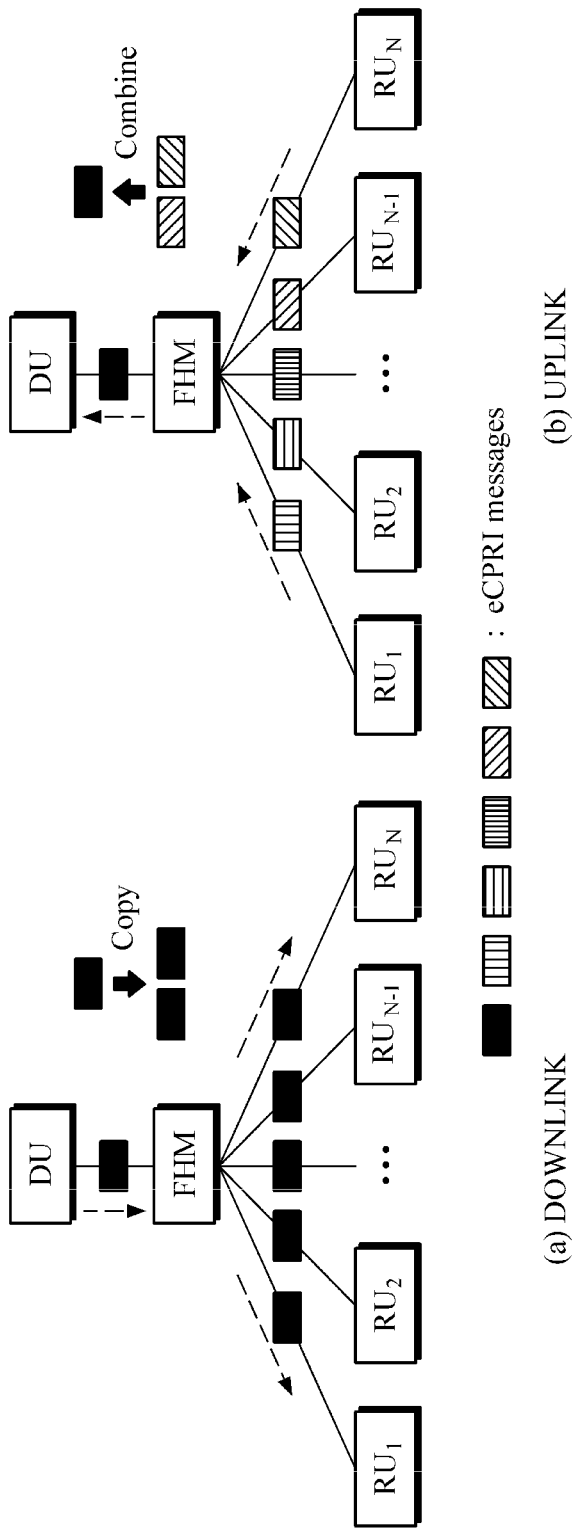
FIG. 2 is a set of views illustrating a concept in which the fronthaul multiplexer of the present invention processes a signal.

FIG. 1 is a set of views illustrating an example in which a fronthaul multiplexer of the present invention is applied to a fronthaul network, and FIG. 2 is a set of views illustrating a concept in which the fronthaul multiplexer of the present invention processes a signal.

As illustrated in FIGS. 1 and 2, a fronthaul multiplexer 100 of the present invention is positioned in a fronthaul section between a digital unit and radio units of a Centralized/Cloud radio access network (C-RAN) structure and processes signals. Although an example in which the fronthaul multiplexer 100 is implemented as a separate apparatus is illustrated in FIGS. 1 and 2, when the radio unit is formed with a cascade structure, the fronthaul multiplexer 100 may be included as a function block in a radio unit having a lower radio unit. The radio unit connected to the fronthaul multiplexer 100 may be provided as a plurality of radio units included in one cell as illustrated in FIG. 1A, or may be provided as radio units included in each of a plurality of cells as illustrated in FIG. 1B.

As illustrated in FIG. 2A, the fronthaul multiplexer 100 copies a downlink signal transmitted from the digital unit toward the radio units and transmits the copied downlink signals to the plurality of radio units. In addition, as illustrated in FIG. 2B, the fronthaul multiplexer 100 is an apparatus which combines uplink signals received from the plurality of radio units into one uplink signal and transmits the one uplink signal to the digital unit. In this case, the uplink signals of the radio units included in the same cell are combined.

For the sake of convenience in the description, it will be described that an enhanced common public radio interface (eCPRI) is used as a fronthaul communication protocol and IQ data is transmitted after being compressed.

Figure 3:
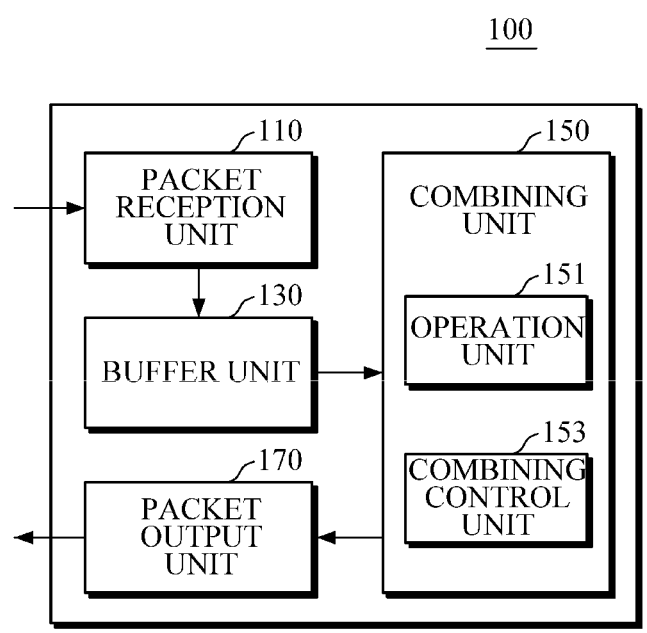
FIG. 3 is a block diagram illustrating a fronthaul multiplexer according to one aspect of the present invention.

FIG. 3 is a block diagram illustrating a fronthaul multiplexer according to one aspect of the present invention. A fronthaul multiplexer 100 according to one aspect of the present invention combines uplink packets received from two or more radio units in a fronthaul network and includes a packet reception unit 110, a buffer unit 130, a combining unit 150, and a packet output unit 170.

In the example of FIG. 1A, the fronthaul multiplexer 100 combines uplink signals, that is, eCPRI messages, received from radio units $RU_1$ to $RU_N$ into one eCPRI message. In addition, in the example of FIG. 1B, the fronthaul multiplexer 100 combines eCPRI messages received from radio units $RU_1$ and $RU_2$ into one eCPRI message and transmits the one eCPRI message to the digital unit, and the fronthaul multiplexer 100 combines eCPRI messages received from radio unit $RU_{N-1}$ and $RU_N$ into another eCPRI message and transmits the another eCPRI message to the digital unit.

Since the fronthaul multiplexer 100 receives and combines eCPRI messages from the plurality of radio units, the fronthaul multiplexer 100 should store the eCPRI messages received from the plurality of radio units for a predetermined time. Times during which uplink signals, that is, the eCPRI messages, transmitted from the radio units arrive at the fronthaul multiplexer 100 differ due to differences in physical distance between the fronthaul multiplexer 100 and the radio units and differences in time during which the radio units process the signals. Accordingly, the fronthaul multiplexer 100 should store eCPRI messages received in advance until all uplink eCPRI messages to be combined are received. A difference in time during which the fronthaul multiplexer 100 performs processing is related to a capacity of a memory. When the fronthaul multiplexer 100 uses a memory having a high capacity, even when messages are received at different times with a larger difference, a combining process may be performed. However, when the fronthaul multiplexer 100 is implemented using a field programmable gate array (FPGA) or an application specific integrated circuit (ASIC), there is a problem in that an internal memory is insufficient, and when an external memory is additionally used, there is a problem in that it is difficult for a throughput of the external memory to satisfy a throughput required by the fronthaul multiplexer 100.

The fronthaul multiplexer 100 of the present invention may allow a difference in time between eCPRI messages received from the radio units to increase using the memory having the same capacity.

The packet reception unit 110 receives uplink packets, that is, eCPRI messages, from two or more radio units included in the same cell. Since the fronthaul network is formed as an optical network, the packet reception unit 110 includes an optical interface, an ethernet medium access control (MAC) layer, and a packet parser which parses an eCPRI message.

The buffer unit 130 includes an internal memory and sequentially stores received packets. A serviceable distance of the fronthaul multiplexer 100 may vary according to a capacity of the internal memory included in the buffer unit 130. The packet stored in the buffer unit 130 is data in units of symbols in a resource grid.

The combining unit 150 includes an operation unit 151 and a combining control unit 153.

The operation unit 151 combines packets in a compressed state that is stored in the buffer unit 130.

When the fronthaul multiplexer of the conventional technology receives uplink packets, the fronthaul multiplexer parses the packets according to an open radio access network (O-RAN) standard, checks a compression method using a parsing result, and decompresses and stores IQ data. The fronthaul multiplexer of the conventional technology extracts signal data to be combined from the packets stored in a reception buffer, combines signals, compresses IQ data resulting from the combination in an original compression method or a compression method set in an apparatus, generates a packet according to the O-RAN standard, and transmits the generated packet to the digital unit. Accordingly, since the above-described process is repeated more as the number of radio units connected to the fronthaul multiplexer of the conventional technology increases, there is a problem in that a delay occurs due to decompression and compression.

The operation unit 151 of the present invention combines packets, that is, compressed IQ data, stored without being decompressed in the buffer unit 130. Accordingly, in a combining process according to the present invention, since a process of decompressing IQ data and recompressing a combined result are omitted, a delay time for combining is reduced when compared to the conventional technology.

A method of combining packets without decompressing the packets according to a method of compressing packets to be combined by the operation unit 151 will be described below.

The combining control unit 153 checks whether packets to be combined are received from all of the radio units by checking packets stored in the buffer unit 130. When the result of checking indicates that all of the packets are received, the combining control unit 153 controls the operation unit 151 to perform a combining operation and outputs a combined result of the operation unit 151.

The packet output unit 170 outputs a combined uplink packet. The packet output unit 170 generates an O-RAN packet including IQ data of the combined result and transmits the O-RAN packet to an upper node (for example, the digital unit, or an upper radio unit in a cascade structure) through the Ethernet MAC layer and the optical interface.

According to another aspect of the present invention, the operation unit 151 of the fronthaul multiplexer 100 may maintain an accumulator which accumulates combined results and maintains the combined results in a memory. In this case, the accumulators equal in number to combining operations performed by the fronthaul multiplexer 100 at the same time are provided. That is, in the example of FIG. 1A, only one accumulator may be maintained, but in the example of FIG. 1B, M accumulators should be maintained.

The operation unit 151 accumulates and combines a compressed packet stored in the buffer unit 130 and a previous combined result, that is, an accumulator.

When the packet is stored in the buffer unit 130, the combining control unit 153 determines whether the packet is to be combined immediately. The combining control unit 153 may determine whether the packet is to be combined by checking whether the packet is received from the radio unit belonging to the cell in which combining is currently being performed, by checking whether the packet is for a symbol in a resource grid in which combining is currently being performed, or the like. When a result of the determination indicates that the packet is to be combined, the combining control unit 153 transmits the packet to the operation unit 151 and allows the operation unit 151 to perform combining. The combining control unit 153 determines whether the combining is completely performed and outputs a combined result of the operation unit 151.

In addition, even when the combining control unit 153 does not receive packets to be combined from all of the radio units until a set waiting time elapses, when the set waiting time has elapsed, the combining control unit 153 instructs the operation unit 151 to perform combining and outputs a combined result of the operation unit 151. When the set waiting time has elapsed, the combining control unit 153 may stop the combining and output a currently stored combined result.

When the combining is completed, the combining control unit 153 may initialize the combined result, that is, the accumulator.

According to the present aspect, the number of packets stored in the buffer unit 130 may be minimized. Theoretically, only a memory having a capacity in which the number of the radio units connected to the buffer unit 130 is multiplied by a size of data of one symbol may be used. In the present aspect, this is because, at a moment at which a packet is stored in the buffer unit 130, the packet is combined with a combined result, that is, an accumulator.

Figure 4:
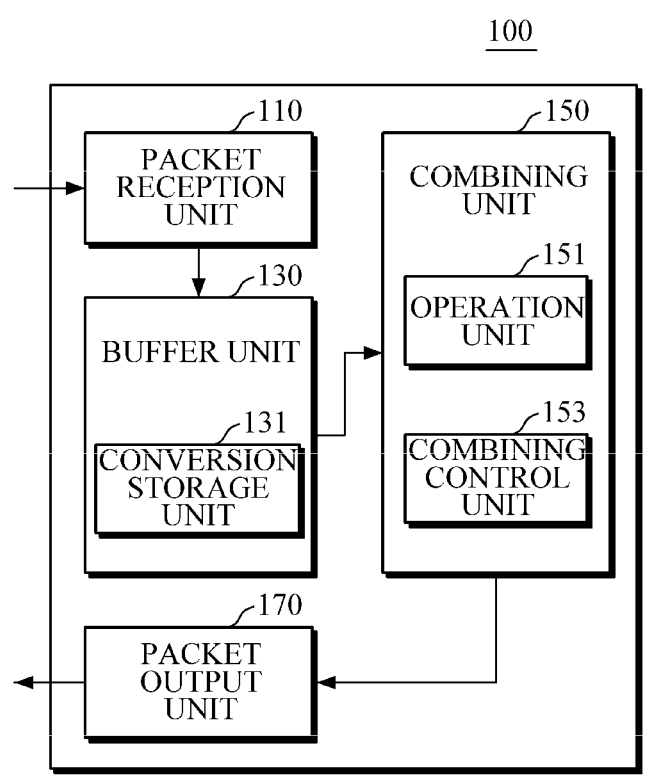
FIG. 4 is a block diagram illustrating a fronthaul multiplexer according to another aspect of the present invention.

FIG. 4 is a block diagram illustrating a fronthaul multiplexer according to still another aspect of the present invention. According to still another aspect of the present invention, a buffer unit 130 may include a conversion storage unit 131.

The conversion storage unit 131 may check a method of compressing received packets, and when the result of checking indicates that the method is not a set first compression method, the conversion storage unit 131 may compress the received packets through the first compression method and store the compressed packets. In this case, the first compression method is a compression method of which compression efficiency is highest among compression methods supported by the fronthaul multiplexer.

Although IQ data included in an eCPRI message is generally compressed in various methods and transmitted, the IQ data may also be transmitted in a state in which the IQ data is not compressed.

When data received in an uncompressed state is stored, a use amount of memory may be significantly reduced when the received data is compressed and stored, and even when received data is compressed data, a use amount of memory may be partially reduced when the compressed data is changed into data compressed in a method of which compression efficiency is higher.

The conversion storage unit 131 may set a compression method of which compression efficiency is highest among methods of compressing IQ data supported by a fronthaul multiplexer 100 as a first compression method, receive an eCPRI message from a radio unit, and check the method of compressing IQ data. In addition, when the eCPRI message is compressed using the first compression method, the eCPRI message is stored without being changed. When the eCPRI message is not compressed or is compressed using another compression method, the eCPRI message may be compressed using the first compression method or compressed using a changed compression method and stored.

According to still another aspect of the present invention, the buffer unit 130 may further include an external memory. An internal memory has a low storage capacity but has a high throughput, and the external memory has a high storage capacity but has a low throughput. The fronthaul multiplexer 100 is an apparatus in which the throughput is more important than a delay time. Accordingly, a delayed process due to the external memory does not significantly affect the performance of the apparatus.

The buffer unit 130 may distribute and store received packets in the internal memory and the external memory at specific distribution rates.

In this case, the specific distribution rates at which the buffer unit 130 distributes the received packets to the internal memory and the external memory may be determined on the basis of a rate between a total throughput of the apparatus and a throughput of the external memory. For example, when the throughput of the external memory is N % of the throughput of the total throughput of the apparatus, the buffer unit 130 distributes only N % of the received data to be stored in the external memory. However, a method of distributing is not limited.

According to still another aspect of the present invention, when a set waiting time has elapsed, the combining control unit 153 may stop combining and output a currently stored combined result.

That is, even when the combining control unit 153 does not receive packets to be combined from all radio units until the set waiting time elapses, when the set waiting time has elapsed, the combining control unit 153 may instruct the operation unit 151 to combine the packets stored in the buffer unit 130 or to output a current combined result of the operation unit 151.

Figure 5:
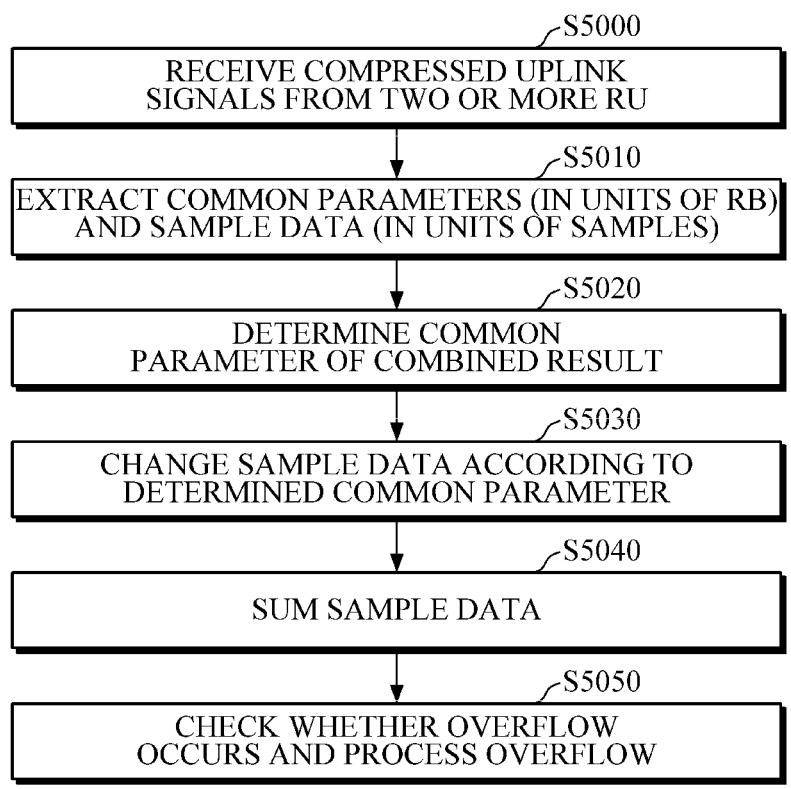
FIG. 5 is a flowchart illustrating a process in which a fronthaul multiplexer of the present invention combines signals without decompressing the signals.

FIG. 5 is a flowchart illustrating a process in which a fronthaul multiplexer of the present invention combines signals without decompressing the signals. Referring to FIG. 5, the packet reception unit 110 receives compressed uplink signals from two or more radio units (S5000). Since the packet reception unit 110 combines IQ data in a compressed state, unlike the conventional technology, packets received from the radio units are stored in the buffer unit 130 without being changed in a compressed state. The received packets may also be changed using another compression method and stored according to an aspect of the invention. The combining control unit 153 selects uplink signals to be combined from the radio units belonging to the same cell among the packets stored in the buffer unit 130 and extracts common parameters in units of resource blocks and pieces of sample data from the compressed uplink signals to be combined (S5010). The common parameter may have a different meaning according to a method of compressing IQ data. For example, when the method of compressing IQ data is a block floating-point compression method, the common parameter is an exponent transmitted in units of resource blocks, and the exponent is an exponent of a mantissa which is sample data in units of samples. Compression method information is included in udCompHdr of parsed U-plane data.

The combining control unit 153 determines a common parameter to be used for a combined result among the common parameters extracted from the uplink signals (S5020) and changes the sample data on the basis of the determined common parameter (S5030), that is, aligns bits of data to be combined. Since bits of a value of sample data vary according to a value of the common parameter, the sample data may not be simply combined.

Then, the combining control unit 153 transmits the sample data to the operation unit 151, and the operation unit 151 sums the sample data in a compressed state (S5040). In this case, the operation unit 151 checks whether overflow occurs and processes the occurring overflow (S5050).

As an example, when a method of compressing IQ data is a block floating-point compression method, a common parameter is exponent data of a floating-point, and sample data is mantissa data.

The combining control unit 153 determines an exponent which is largest among common parameters, that is, exponent data extracted from uplink signals as an exponent to be used for a combined result, and changes mantissa data so that exponent data becomes the same. That is, on the basis of the determined exponent data, mantissas each having a small exponent value are changed through shift operations to correspond to the determined exponent data.

When overflow occurs after a combining operation is performed, the operation unit 151 processes the overflow by increasing a value of the exponent by one and right-shifting summed mantissa data by one bit (which is an arithmetic operation and is the same as dividing by two).

As another example, a method of compressing IQ data is a block scaling compression method, a common parameter is a block scaler, and sample data is data scaled by the block scaler.

The combining control unit 153 determines a block scaler which is largest among common parameters, that is, block scalers, extracted from uplink signals as a block scaler to be used for a combined result, and changes sample data so that the block scalers become the same.

The combining control unit 153 obtains a value of an inverse block scaler of a large block scaler in order to change sample data of a small block scaler. In this case, when the value of the block scaler is defined by a fixed point of a Q1.7 format, the value of the inverse block scaler is 27 divided by the value of the block scaler, and the value of the inverse block scaler may be stored in a table for the sake of efficiency in calculation. The combining control unit 153 multiplies a value of the small block scaler and the obtained value of the inverse block scaler, multiplies a result of multiplication and sample data of the small block scaler, and performs a right-shift operation in order to align bits.

Then, the combining control unit 153 transmits the sample data to the operation unit 151, and the operation unit 151 sums the sample data in a compressed state. In this case, the operation unit 151 checks whether overflow occurs and process the occurring overflow.

The following <Equation 1> is an equation showing that a result of decompressing and summing IQ data compressed using the block scaling compression method is the same as a result of summing the IQ data without decompressing the IQ data.

$$Y = X1 \times sblockScaler1 + X2 \times sblockScaler2 = $$
$$sblockScaler1 \times \left(X1 + X2 \times \frac{sblockScaler2}{sblocker1}\right) = sblockScaler1 \times $$
$$(X1 + (X2 \times sblockScaler2 \times InverseSblockScaler1 \gg 7))$$
$$\text{where } InverseSblockScaler1 = \frac{2^7}{sblockScaler1},$$
$$sblockScaler1 > sblockScaler2$$

[Equation]

X1 and X2 are sample data, sblockScaler1 and sblockScaler2 are block scalers, and InverseSblockScaler1 is an inverse block scaler of sblockScaler1.

(X2×sblockscaler2×Inversesblockscaler1>>7) is a partial expression showing a process of changing sample data of a small block scaler.

The operation unit 151 checks whether overflow occurs, and when overflow occurs, the operation unit 151 left-shifts a value of a common parameter, that is, a block scaler, to be used for a combined result by one bit and right-shifts summed sample data by one bit.

As still another example, when a method of compressing IQ data is a block scale compression method, a common parameter is a compression shift, and sample data is a sign and a mantissa.

The combining control unit 153 determines a smallest compression shift among common parameters, that is, compression shifts, extracted from uplink signals as a compression shift to be used for a combined result and changes sample data so that the compression shifts become the same.

The combining control unit 153 changes the sample data on the basis of the compression shift and the upper two bits of the mantissa. A method of changing sample data is that a mantissa (which is a size of compBitWidth of a U-plane IQ data format) is changed to a value which is greater by one bit (compBitWidth+1), when a value of the upper two bits is three, the value of the upper two bits is changed to zero, and the first bit is combined with the remaining bit excluding the upper two bits and is left-shifted by two bits. In addition, when the value of the upper two bits is two, the value of the upper two bits is changed to zero, and the first bit is combined with the remaining bit excluding the upper two bits and is left-shifted by one bit. In addition, when the value of the upper two bits is zero or one, the value of the upper two bits is changed to zero, and a bit string corresponding to the value of the upper two bits is combined with the remaining bit excluding the upper two bits.

Then, the combining control unit 153 transmits the sample data to the operation unit 151, and the operation unit 151 sums the sample data in a compressed state. In this case, the operation unit 151 checks whether overflow occurs and processes the occurring overflow.

The operation unit 151 checks whether overflow occurs, and when overflow occurs, the operation unit 151 decreases a value of a common parameter, that is, a compression shift, to be used for a combined result by one, sets summed mantissa data so that the value of the upper two bits is set to three, and sets the remaining bit to the value of a remaining upper bit (upper compBitWidth-2 bit is set as a lower bit of the mantissa). When no overflow occurs, according to a position at which a first one is shown from a left side of the combined mantissa, the operation unit 151 sets the upper two bits to a value at which a value of the position at which the first one is shown is subtracted from four. When the value of the position at which the first one is shown is four or more, the value of the upper two bits is set to zero.

The example of the method of combining signals compressed using various compression methods without decompressing has been described above. The method of combining signals compressed using compression methods without decompressing is not limited to the above-described methods.

According to the present invention, a serviceable area can be expanded by optimizing the use of a memory in a fronthaul network and using a memory having the same capacity.

In addition, according to the present invention, compressed IQ data of uplink signals can be combined without being decompressed in the fronthaul network.

Although the present invention has been described above with reference to the accompanying drawings, the present invention is not limited thereto and should be construed as encompassing various modifications which may be clearly derived therefrom by those skilled the art. The claims are intended to encompass the various modifications.

What is claimed is:

1. A fronthaul multiplexer which combines uplink packets received from two or more radio units in a fronthaul network, the fronthaul multiplexer comprising:
   a packet receiver configured to receive uplink packets from two or more radio units;
   a buffer which includes an internal memory and is configured to sequentially store the received uplink packets;
   a combiner including an operation circuitry which combines the packets in a compressed state that is stored in the buffer and a controlling circuitry which instructs the operation circuitry to combine the packets when all packets to be combined are received and outputs a combined result of the operation circuitry; and
   a packet transmitter which outputs a combined uplink packet,
   wherein:
   the operation circuitry accumulates and maintains the combined result and accumulates the received uplink packets in the compressed state that is stored in the buffer with a previously combined result; and
   when the received uplink packets are stored in the buffer, the controlling circuitry determines whether the received uplink packets are to be combined, transmits the received uplink packets to the operation circuitry, determines whether combining is completed, outputs the combined result of the operation circuitry, and initializes the combined result.

2. The fronthaul multiplexer of claim 1, wherein:
   the buffer includes a conversion storage, wherein the buffer checks a compression method of the received uplink packets, and when a checking result indicates that the compression method is not a set first compression method, the received uplink packets are recompressed using the first compression method and stored in the conversion storage; and
   the first compression method is a compression method of which compression efficiency is highest among compression methods supported by the fronthaul multiplexer.

3. The fronthaul multiplexer of claim 1, wherein:
   the buffer further includes an external memory;
   the buffer distributes and stores the received uplink packets in the internal memory and the external memory; and
   a distribution rate is determined on the basis of a rate between a total throughput of the fronthaul multiplexer and a throughput of the external memory.

4. The fronthaul multiplexer of claim 1, wherein, when a set waiting time has elapsed, the controlling circuitry stops combining and outputs a currently stored combined result.

* * * * *